United States Patent
Kellogg

(10) Patent No.: US 11,227,749 B2
(45) Date of Patent: Jan. 18, 2022

(54) 3D PRINTED PLASMA ARRESTOR FOR AN ELECTROSTATIC CHUCK

(71) Applicant: Lam Research Corporation, Fremont, CA (US)

(72) Inventor: Michael Kellogg, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 615 days.

(21) Appl. No.: 15/046,959

(22) Filed: Feb. 18, 2016

(65) Prior Publication Data

US 2017/0243726 A1 Aug. 24, 2017

(51) Int. Cl.
| | |
|---|---|
| *H01J 37/32* | (2006.01) |
| *H01L 21/67* | (2006.01) |
| *H01L 21/683* | (2006.01) |
| *B28B 1/00* | (2006.01) |
| *B33Y 10/00* | (2015.01) |

(Continued)

(52) U.S. Cl.
CPC ........ *H01J 37/32724* (2013.01); *B28B 1/001* (2013.01); *H01J 37/32697* (2013.01); *H01L 21/67109* (2013.01); *H01L 21/6831* (2013.01); *B29L 2031/7502* (2013.01);
(Continued)

(58) Field of Classification Search
CPC ..... B29C 64/153; B29C 64/188; B33Y 10/00; B33Y 80/00
See application file for complete search history.

(56) References Cited

U.S. PATENT DOCUMENTS

| | | | | | |
|---|---|---|---|---|---|
| 5,415,233 | A | * | 5/1995 | Roussakis | A62C 4/02 169/48 |
| 6,699,035 | B2 | * | 3/2004 | Brooker | A62C 4/02 220/88.2 |

(Continued)

FOREIGN PATENT DOCUMENTS

| | | | | |
|---|---|---|---|---|
| FR | 2941380 A1 | * | 7/2010 | A62C 4/00 |
| WO | WO-2018044671 A1 | * | 3/2018 | A62C 4/02 |

OTHER PUBLICATIONS

Gibson, I.; Rosen, D.; Stucker, B. Additive Manufacturing Technologies, second edition. New York: Springer. (2015) pp. 219-243.*

(Continued)

*Primary Examiner* — Duane Smith

(57) ABSTRACT

A method for manufacturing an arrestor for an electrostatic chuck includes printing first layers of an arrestor for an electrostatic chuck using a 3-D printer and an electrically non-conductive material. The first layers of the arrestor at least partially define a first opening to a gas flow channel. The method includes printing intermediate layers of the arrestor using the 3-D printer and the electrically non-conductive material. The intermediate layers of the arrestor at least partially define the gas flow channel. The method includes printing second layers of the arrestor using the 3-D printer and the electrically non-conductive material. The second layers of the arrestor at least partially define a second opening of the gas flow channel. At least one of the first opening, the second opening and/or the gas flow channel of the arrestor is arranged to prevent a direct line of sight between the first opening and the second opening of the arrestor.

9 Claims, 5 Drawing Sheets

(51) Int. Cl.
  *B33Y 80/00* (2015.01)
  *B29L 31/00* (2006.01)
(52) U.S. Cl.
  CPC ............... *B33Y 10/00* (2014.12); *B33Y 80/00* (2014.12); *H01J 2237/334* (2013.01)

(56) References Cited

U.S. PATENT DOCUMENTS

| | | | |
|---|---|---|---|
| 10,622,195 B2* | 4/2020 | Bise | .................. H01J 37/32724 |
| 2007/0175861 A1 | 8/2007 | Hwang et al. | |
| 2011/0017645 A1* | 1/2011 | Hongo | ....................... B03B 5/00 |
| | | | 209/157 |
| 2011/0075313 A1* | 3/2011 | Comendant | ....... H01L 21/67069 |
| | | | 361/121 |
| 2014/0231266 A1 | 8/2014 | Sherrer et al. | |
| 2016/0023272 A1* | 1/2016 | Mongillo, Jr. | ............ B22F 5/04 |
| | | | 416/95 |
| 2016/0352260 A1* | 12/2016 | Comendant | ............ H02N 13/00 |
| 2016/0354756 A1* | 12/2016 | Kamler | ................ B01J 19/2485 |
| 2017/0144226 A1* | 5/2017 | Giulietti | ................ B33Y 40/00 |
| 2017/0239726 A1* | 8/2017 | Palumbo | ................ B33Y 80/00 |

OTHER PUBLICATIONS

Translation of the First Office Action dated Aug. 11, 2020 corresponding to Taiwanese Patent Application No. 106104554, 5 pages.
Translation of the Notice of Allowance dated Jan. 8, 2020 corresponding to Taiwanese Patent Application No. 106104554, 2 pages.

* cited by examiner

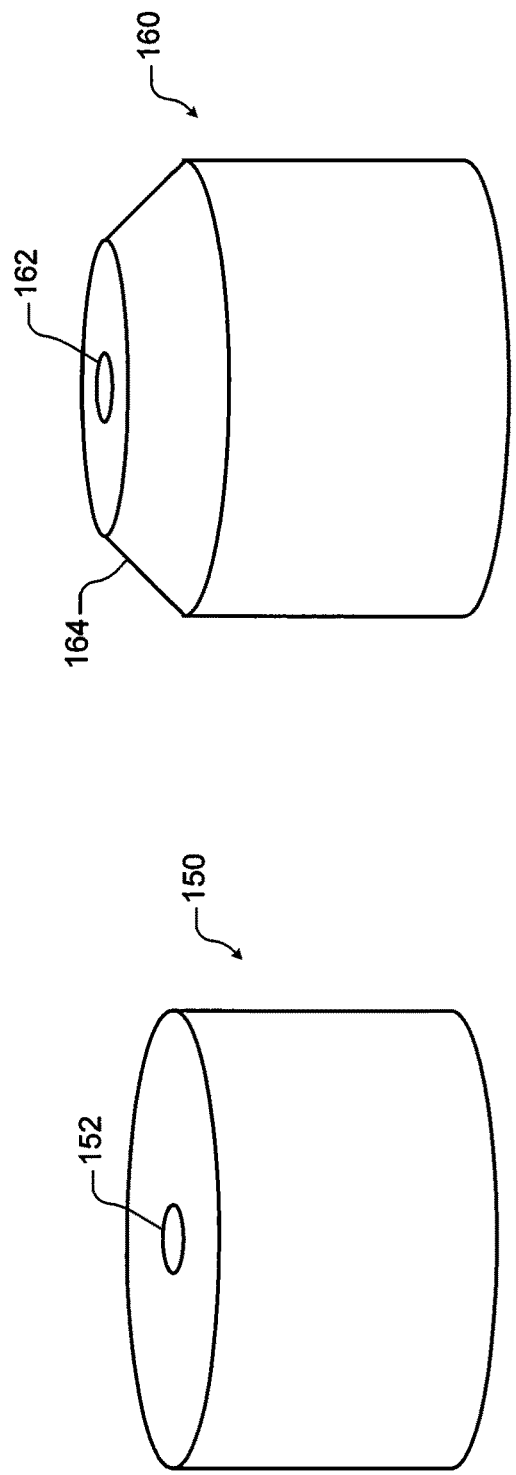
FIG. 2
FIG. 4
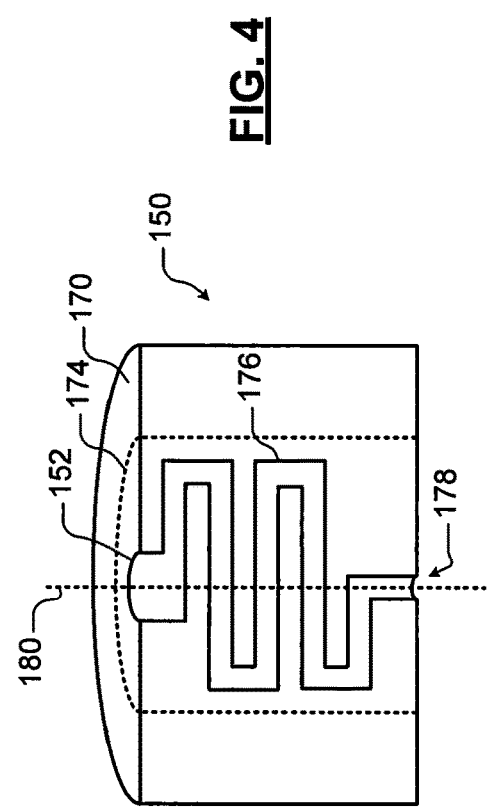
FIG. 3

3D PRINTED PLASMA ARRESTOR FOR AN ELECTROSTATIC CHUCK

FIELD

The present disclosure relates to substrate processing systems, and more particularly to a plasma arrestor for a baseplate of an electrostatic chuck.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

In some applications, an inert gas such as helium may be supplied to a back side of the substrate (hereinafter "backside gas"). The backside gas can be used to provide heat transfer between the substrate and an electrostatic chuck (ESC) or other substrate support.

Referring now to FIG. 1, an example of an ESC 50 includes a ceramic body 52 defining an upper planar surface for supporting the substrate during processing. Heaters 54 may be embedded in the ceramic body 52 to adjust a temperature of the ceramic body 52. Gas flow channels 56 may be formed on a substrate-facing surface of the ceramic body 52 to allow flow of gas between the substrate and the ESC 50. Another gas flow channel 60 passes through the ceramic body 52.

A baseplate 70 defines cooling channels 72 and 74. Fluid such as gas or liquid flows through the cooling channels 72 and 74 to control a temperature of the ESC 50. An intermediate plate 76 may be arranged between the baseplate 70 and the ceramic body 52. The baseplate 70 further defines a gas flow channel 80 for receiving an inert gas. The baseplate 70 and the intermediate plate 76 define openings 82 and 84.

An arrestor 90 is arranged in the opening 82. The arrestor 90 typically includes a sintered porous ceramic material 92. The sintered porous ceramic material is ground to a predetermined shape to mate with the opening 82, the baseplate 70 and the intermediate plate 76. An outer diameter 94 of the arrestor 90 may be plasma spray coated.

During operation, backside gas flows through the gas flow channel 80, the opening 84, the arrestor 90, and the gas flow channel 60 into the gas flow channel 56 below the substrate. The arrestor 90 flows backside gas to the gas flow channel 56 while preventing a direct line of sight between ceramic body 52 and the baseplate 70 and between a gas inlet and a gas outlet of the arrestor 90. The process for making the arrestor 90 is expensive and time consuming since ceramic is difficult to work with.

SUMMARY

A method for manufacturing an arrestor for an electrostatic chuck includes printing first layers of an arrestor for an electrostatic chuck using a 3-D printer and an electrically non-conductive material. The first layers of the arrestor at least partially define a first opening to a gas flow channel. The method includes printing intermediate layers of the arrestor using the 3-D printer and the electrically non-conductive material. The intermediate layers of the arrestor at least partially define the gas flow channel. The method includes printing second layers of the arrestor using the 3-D printer and the electrically non-conductive material. The second layers of the arrestor at least partially define a second opening of the gas flow channel. At least one of the first opening, the second opening and/or the gas flow channel of the arrestor is arranged to prevent a direct line of sight between the first opening and the second opening of the arrestor.

In other features, the arrestor is made of ceramic, glass or plastic. The arrestor has a cylindrical outer shape. The direct line of sight is a straight line defined between the first opening and the second opening. The gas flow channel deviates relative to the direct line of sight.

In other features, one of the first opening and the second opening is arranged at a center of a first surface of the arrestor and the other of the first opening and the second opening is arranged on a second surface of the arrestor at an offset location relative to a center of the second surface of the arrestor. The first opening comprises a gas inlet of the arrestor and the second opening comprises a gas outlet of the arrestor. The first opening comprises a gas outlet of the arrestor and the second opening comprises a gas inlet of the arrestor.

An arrestor for an electrostatic chuck includes an arrestor body made of an electrically non-conductive, 3-D printed material. A gas inlet is arranged on one surface of the arrestor. A gas outlet is arranged on another surface of the arrestor. A gas flow channel fluidly connects the gas inlet to the gas outlet. At least one of the gas flow channel, the gas inlet and/or the gas outlet is arranged to prevent a direct line of sight between the gas inlet and the gas outlet of the arrestor.

In other features, the electrically non-conductive, 3-D printed material includes ceramic, glass or plastic. The arrestor has a cylindrical outer shape. The direct line of sight is defined between the gas inlet and the gas outlet. The gas flow channel deviates laterally relative to the direct line of sight.

In other features, one of the gas inlet and the gas outlet is arranged at a center of a first surface of the arrestor and the other of the gas inlet and the gas outlet is arranged on a second surface of the arrestor at an offset location relative to a center of the second surface of the arrestor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2-3 are side perspective views of examples of arrestors according to the present disclosure;

FIGS. 4-7 are side cross-sectional, perspective views of examples of arrestors according to the present disclosure;

In the drawings, reference numbers may be reused to identify similar and/or identical elements.

DETAILED DESCRIPTION

Figure 1:
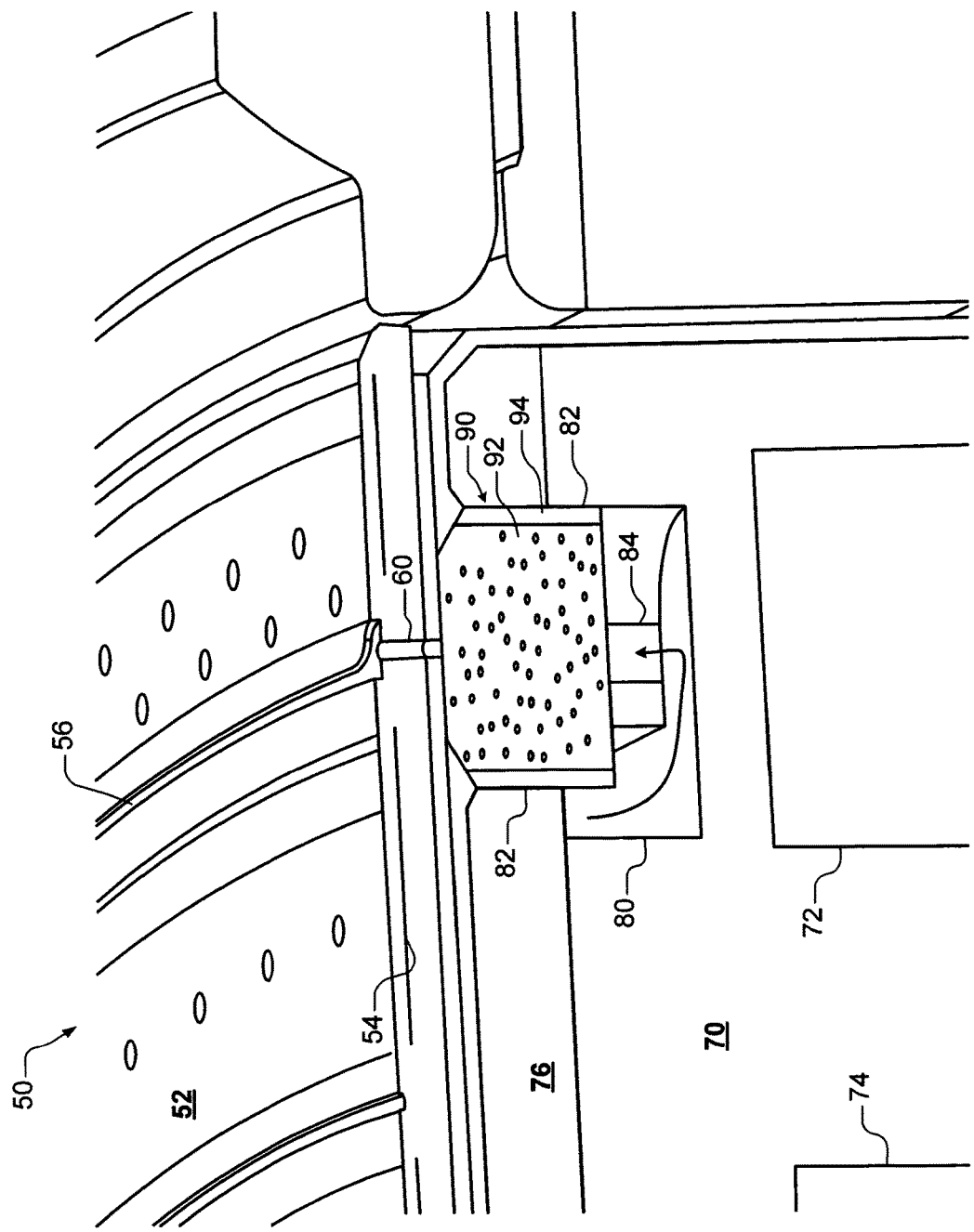
FIG. 1 is a perspective view of an electrostatic chuck including an arrestor according to the prior art.

The present disclosure relates to systems and methods for making an arrestor for a baseplate of an ESC (or other substrate support) or for other applications flowing gas while preventing a direct line of sight from a gas inlet to a gas outlet. In some examples, the arrestor is made from an electrically non-conductive material such as ceramic, glass, plastic, etc. that can be printed using a 3D printer to form a solid or semi-solid structure. A gas flow channel including a gas inlet and a gas outlet is defined in an inner portion of the arrestor to flow backside gas through the arrestor. The gas flow channel defines a gas flow path that does not have a direct line of sight from the gas inlet to the gas outlet.

Referring now to FIGS. 2-3, examples of exterior body shapes for arrestors are shown. In FIG. 2, an arrestor 150 includes a gas outlet 152 and has a cylindrical body shape. In FIG. 3, an arrestor 160 includes a gas outlet 162 and has a cylindrical body shape with a tapered portion 164 adjacent to the gas outlet 162. While specific examples of body shapes are shown for the arrestor, still other body shapes may be used.

Referring now to FIG. 4, the arrestor 150 is shown in further detail. A radially outer portion 170 of the arrestor 150 may be solid. Alternately, the radially outer portion 170 may include air gaps, pores or other non-solid portions. In some examples, the radially outer portion 170 prevents a direct line of sight from an interior of the ESC 50 to the gas outlet 152 of the arrestor 150. A radially inner portion 174 of the arrestor 150 defines a gas flow channel 176 that connects a first opening (e.g., a gas inlet 178) of the arrestor 150 to a second opening (e.g., the gas outlet 152) of the arrestor 150.

As can be seen in FIG. 4 at 180, the gas flow channel 176 defines a path through the radially inner portion 174 such that there is no direct line of sight between the gas outlet 152 and the gas inlet 178. Other than the gas flow channel 176, the radially inner portion 174 of the arrestor 150 may be solid. Alternately, the radially inner portion 174 may include air gaps, pores or other non-solid portions that do not communicate with the gas flow channel 176. In some examples, the gas flow channel 176 in FIG. 4 defines a path that traverses from the gas inlet 178 across the radially inner portion 174 away from the line of sight 180 and then returns back across the line of sight 180 one or more times before connecting to the gas outlet 152.

Figure 5:
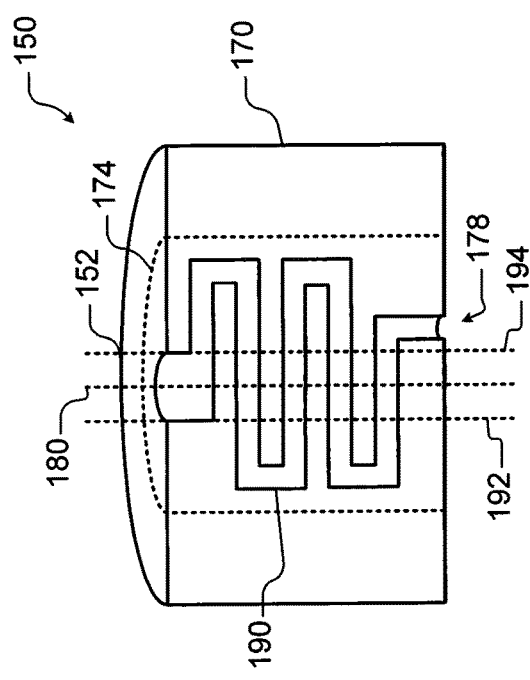

Referring now to FIG. 5, another example of the arrestor 150 is shown. In this example, the gas inlet 178 of a gas flow channel 190 is located radially outwardly relative to opposite edges 192 and 194 of the gas outlet 152.

Figure 6:
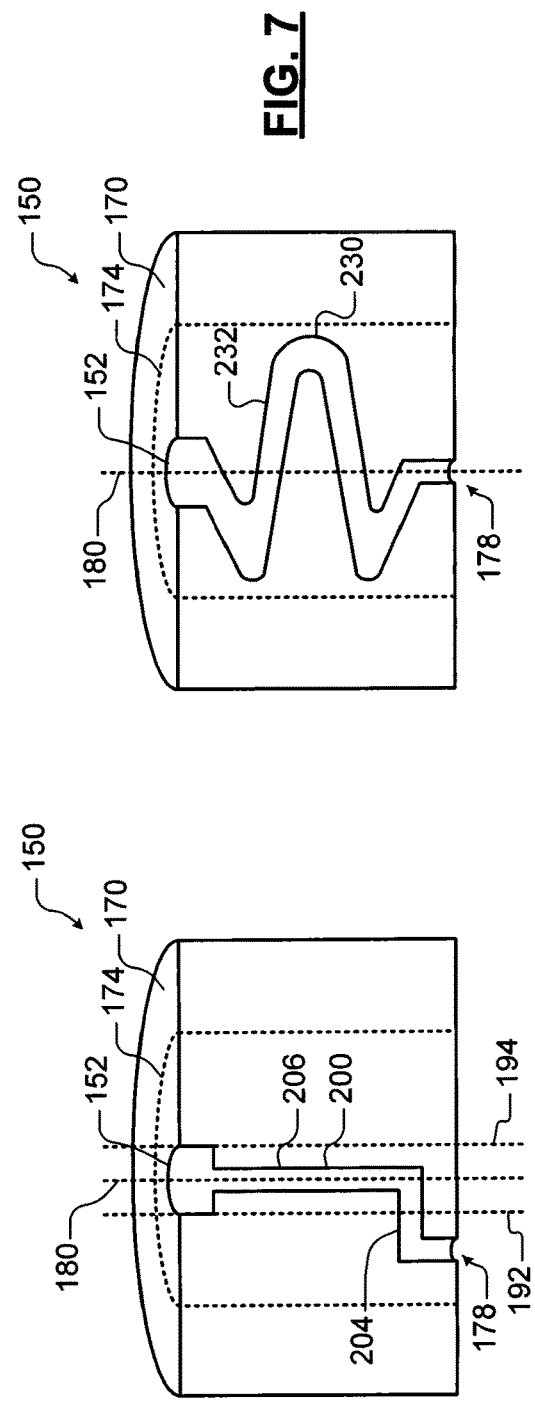

Referring now to FIG. 6, another example of the arrestor 150 is shown. The gas inlet 178 of a gas flow channel 200 is arranged radially outside of the opposite edges 192 and 194 of the gas outlet 152. The gas flow channel 200 includes a first portion 204 and a second portion 206. The first portion 204 is a right-angled section that connects the gas inlet 178 in a radial direction to the second portion 206. The second portion 206 is a predominantly straight, axial portion connected to the gas outlet 152.

Figure 7:
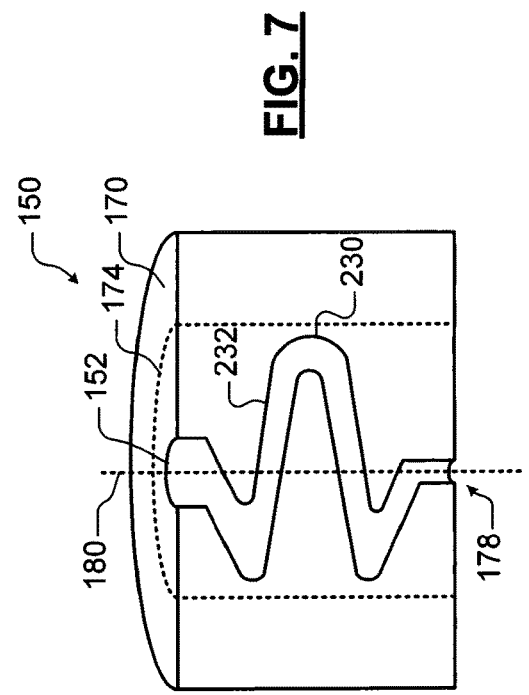

Referring now to FIG. 7, another example of the arrestor 150 is shown. A gas inlet 178 of a gas flow channel 230 is arranged along the line of sight 180. The gas flow channel 230 includes curved corner portions. Intermediate portions 232 are arranged diagonally relative to either radial or axial directions.

Figure 8A:
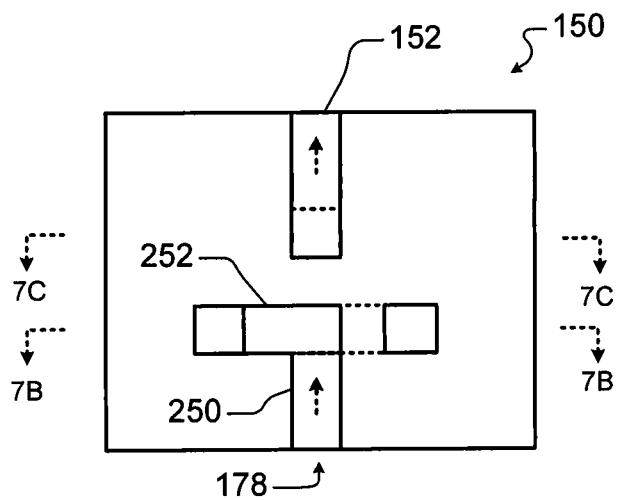
FIGS. 8A-8C are side and plan cross-sectional, perspective views of examples of arrestors according to the present disclosure.
Figure 8B:
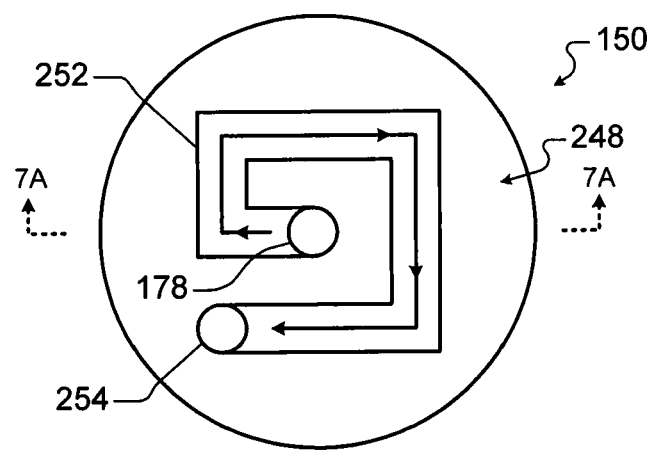
Figure 8C:
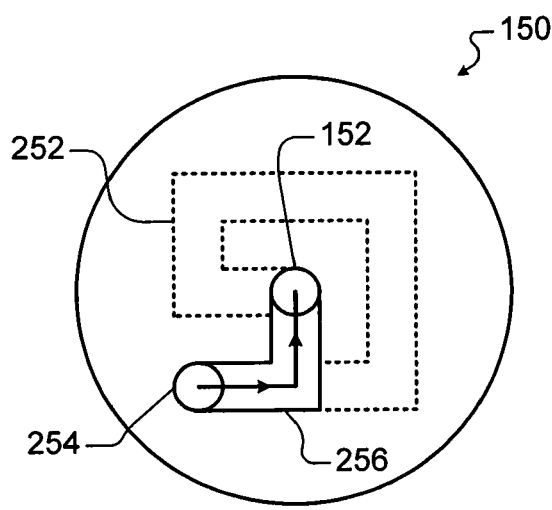

While the preceding examples of arrestors define gas flow paths that are generally located in a single plane, the gas flow paths can be arranged in more than one plane. Referring now to FIGS. 8A-8C, an arrestor 150 defines a gas flow channel 248 that is arranged in more than one plane. A first portion 250 extends upwardly in an axial direction from the gas inlet 178 to a second portion 252 that is arranged in a first radial plane transverse to the axial direction. The second portion 252 connects to a third portion 254 that extends in an axial direction. The third portion 254 is connected to a fourth portion 256 that is arranged in a second radial plane transverse to the axial direction. The fourth portion 256 connects to the gas outlet 152.

Figure 9:
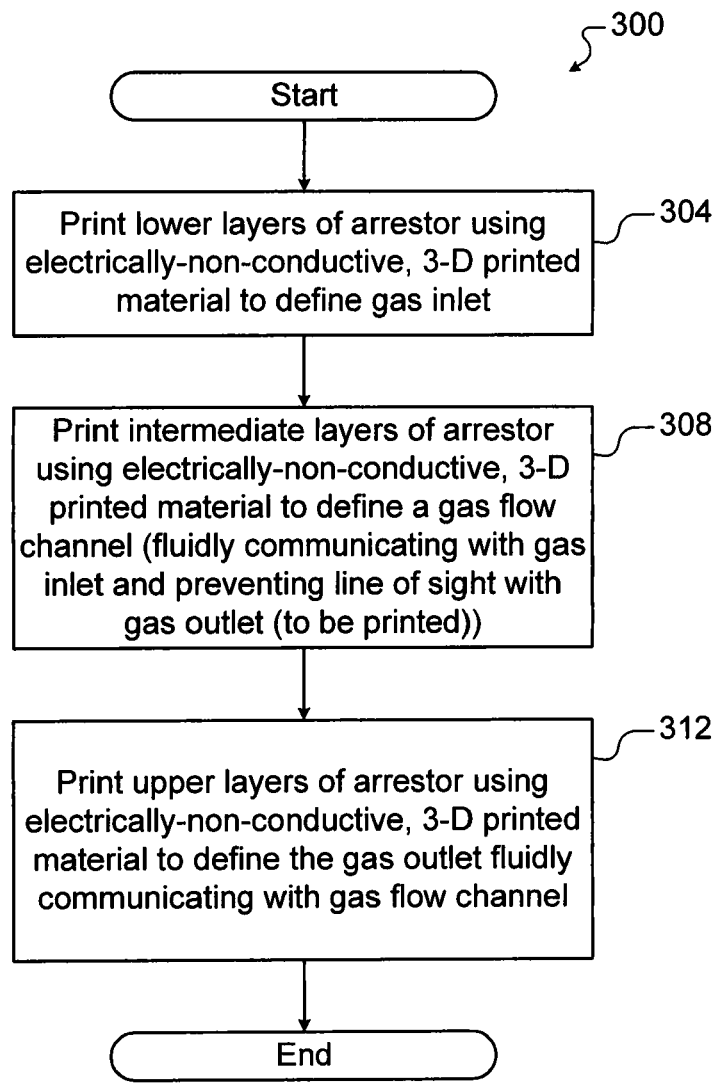
FIG. 9 is a flowchart illustrating an example of a method for manufacturing an arrestor according to the present disclosure.

Referring now to FIG. 9, a method 300 for 3-D printing an arrestor that prevents a direct line of sight between a first opening such as a gas inlet and a second opening such as a gas outlet of the arrestor is shown. At 304, lower layers of the arrestor are printed using electrically-non-conductive, 3-D printed material. The lower layers define a lower portion of the body and the gas inlet. At 308, intermediate layers of the arrestor are printed using electrically-non-conductive, 3-D printed material. The intermediate layers define middle portions of the body and a gas flow channel (fluidly communicating with gas inlet and preventing line of sight with gas outlet to be printed later). At 312, upper layers of the arrestor are printed using electrically-non-conductive, 3-D printed material. The upper layers define an upper portion of the body and the gas outlet fluidly communicating with gas flow channel. As can be appreciated, the arrestor may be printed starting with the gas outlet and then proceeding to the gas inlet (or from side to side or other orientations).

When using ceramic rather than plastic, additional steps may be performed. After 3-D printing is complete, thermal de-binding and thermal sintering may be performed. Thermal de-binding includes thermal decomposition of binder in the 3-D printed ceramic material. This can be performed by heating the arrestor to a predetermined temperature range. Pressure and gas flows may also be controlled during de-binding. After thermal de-binding is complete, sintering of the arrestor can be performed. Alternately, thermal de-binding and sintering can be done together.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for manufacturing a plasma arrestor for an electrostatic chuck configured to support a semiconductor substrate during processing, the electrostatic chuck including at least one plasma arrestor, the method comprising:
   using a 3-D printer to manufacture the plasma arrestor by:
   printing first, lower layers of the plasma arrestor using an electrically non-conductive material, wherein the first, lower layers of the plasma arrestor include and at least partially define a first opening to a gas flow channel through the first, lower layers in a vertical direction;
   subsequent to printing the first, lower layers, printing intermediate layers of the plasma arrestor on the first, lower layers using the electrically non-conductive material, wherein the intermediate layers of the plasma arrestor at least partially define the gas flow channel and connect the gas flow channel to the first opening defined in the first, lower layers; and
   subsequent to printing the intermediate layers, printing second, upper layers of the plasma arrestor on the intermediate layers using the electrically non-conductive material, wherein the second, upper layers of the plasma arrestor include and at least partially define a second opening of the gas flow channel through the second, upper layers in the vertical direction, and wherein at least one of the first opening, the second opening and/or the gas flow channel of the plasma arrestor is arranged to prevent a direct line of sight between the first opening and the second opening of the plasma arrestor; and
   arranging the plasma arrestor in an opening in the electrostatic chuck such that the plasma arrestor provides fluid communication between a first gas flow channel in a baseplate of the electrostatic chuck and a second gas flow channel in a ceramic body of the electrostatic chuck.

2. The method of claim 1, wherein the plasma arrestor is made of ceramic.

3. The method of claim 1, wherein the plasma arrestor is made of glass.

4. The method of claim 1, wherein the plasma arrestor is made of plastic.

5. The method of claim 1, wherein the plasma arrestor has a cylindrical outer shape.

6. The method of claim 1, wherein the direct line of sight is a straight line defined between the first opening and the second opening and wherein the gas flow channel deviates relative to the direct line of sight.

7. The method of claim 1, wherein one of the first opening and the second opening is arranged at a center of a first surface of the plasma arrestor and the other of the first opening and the second opening is arranged on a second surface of the plasma arrestor at an offset location relative to a center of the second surface of the plasma arrestor.

8. The method of claim 1, wherein the first opening comprises a gas inlet of the plasma arrestor and the second opening comprises a gas outlet of the plasma arrestor.

9. The method of claim 1, wherein the first opening comprises a gas outlet of the plasma arrestor and the second opening comprises a gas inlet of the plasma arrestor.

* * * * *